(12) United States Patent
Zundel et al.

(10) Patent No.: US 9,142,444 B2
(45) Date of Patent: Sep. 22, 2015

(54) SEMICONDUCTOR COMPONENT AND METHOD FOR PRODUCING A SEMICONDUCTOR COMPONENT

(71) Applicant: INFINEON TECHNOLOGIES AG, Neubiberg (DE)

(72) Inventors: Markus Zundel, Egmating (DE); Erwin Bacher, Villach (AT); Andreas Behrendt, Villach (AT); Joerg Ortner, Drobollach (AT); Walter Rieger, Arnoldstein (AT); Rudolf Zelsacher, Klagenfurt (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/895,132

(22) Filed: May 15, 2013

(65) Prior Publication Data
US 2013/0323905 A1    Dec. 5, 2013

Related U.S. Application Data

(62) Division of application No. 12/568,915, filed on Sep. 29, 2009, now abandoned.

(30) Foreign Application Priority Data

Sep. 30, 2008 (DE) .................. 10 2008 049 667
Nov. 25, 2008 (DE) .................. 10 2008 058 974

(51) Int. Cl.
| | | |
|---|---|---|
| H01L 21/8242 | (2006.01) | |
| H01L 21/762 | (2006.01) | |
| H01L 29/06 | (2006.01) | |
| H01L 29/40 | (2006.01) | |
| H01L 29/78 | (2006.01) | |
| H01L 21/8234 | (2006.01) | |
| H01L 29/861 | (2006.01) | |

(52) U.S. Cl.
CPC ...... *H01L 21/76224* (2013.01); *H01L 29/0657* (2013.01); *H01L 29/407* (2013.01); *H01L 29/7803* (2013.01); *H01L 29/7804* (2013.01); *H01L 29/7813* (2013.01); *H01L 29/0696* (2013.01); *H01L 29/861* (2013.01)

(58) Field of Classification Search
CPC . H01L 27/0255; H01L 29/00; H01L 29/1037; H01L 29/66007; H01L 29/6603; H01L 29/66096; H01L 29/66136; H01L 29/66704
USPC ......... 438/141, 143, 197, 212, 237, 249, 270, 438/689, 692, 700
See application file for complete search history.

(56) References Cited

U.S. PATENT DOCUMENTS 5,311,039 A * 5/1994 Kimura et al. .............. 257/50
5,354,712 A * 10/1994 Ho et al. ................... 438/643

(Continued)

FOREIGN PATENT DOCUMENTS

DE    102004054352 B3    2/2006
WO    2005076362 A2    8/2005

*Primary Examiner* — Galina Yushina
(74) *Attorney, Agent, or Firm* — SpryIP, LLC (57) ABSTRACT

A semiconductor component comprises a semiconductor body with at least one protective trench in the semiconductor body. An insulation layer is situated at least at the bottom of the protective trench. An electrically conductive layer having a thickness D is formed on the insulation layer in the protective trench, wherein the electrically conductive layer only partly fills the protective trench.

14 Claims, 4 Drawing Sheets

(56) References Cited

U.S. PATENT DOCUMENTS

| | | |
|---|---|---|
| 5,684,310 A | 11/1997 | Liu |
| 5,828,100 A | 10/1998 | Tamba et al. |
| 6,660,619 B1 | 12/2003 | Pangrle et al. |
| 6,936,511 B2 | 8/2005 | Divakaruni et al. |
| 7,715,162 B2 | 5/2010 | Krutsick |
| 2003/0032291 A1* | 2/2003 | Chen et al. .............. 438/689 |
| 2003/0210507 A1 | 11/2003 | Pihet et al. |
| 2005/0258464 A1 | 11/2005 | Zundel et al. |
| 2006/0113577 A1 | 6/2006 | Ohtani |
| 2006/0275980 A1* | 12/2006 | Sakakibara et al. ........ 438/253 |
| 2007/0042550 A1 | 2/2007 | Vannucci et al. |
| 2007/0093019 A1 | 4/2007 | Rieger et al. |
| 2007/0138544 A1* | 6/2007 | Hirler et al. ............... 257/330 |
| 2007/0145411 A1* | 6/2007 | Chen et al. ................ 257/173 |
| 2007/0176212 A1 | 8/2007 | Zundel et al. |
| 2008/0088355 A1 | 4/2008 | Von Borcke et al. |
| 2008/0116511 A1 | 5/2008 | Zundel et al. |

\* cited by examiner

SEMICONDUCTOR COMPONENT AND METHOD FOR PRODUCING A SEMICONDUCTOR COMPONENT

RELATED U.S. APPLICATION DATA

This application is a divisional of U.S. application Ser. No. 12/568,915 filed on Sep. 29, 2009. The prior filed application is hereby fully incorporated herein by reference.

FOREIGN APPLICATION PRIORITY DATA

The present application claims priority, via U.S. application Ser. No. 12/568,915 filed on Sep. 29, 2009, to German patent application no. 102008058974.8, filed Nov. 25, 2008, and German patent application no. 102008049667.7, filed Sep. 30, 2008, the disclosures of which are hereby incorporated by reference.

BACKGROUND

Progressive miniaturization in semiconductor components requires surface treatments of the semiconductor body, for example so-called CMP (Chemical Mechanical Polishing) processes, wherein surface topologies at the semiconductor body are removed as far as possible. Thus, by way of example, new generations of transistors require ever smaller and more precise geometries for, for example, trench, recess and dopant structures. In order to realize very short transistor channel lengths in the case of trench transistors, for example, extremely high requirements are made of the recess processes. This has the consequence that CMP processes, such as gatepoly CMP, for example, become absolutely necessary before the actual recess processes for the purpose of levelling the semiconductor body surface, in order to attain the highly precise recess depths including manufacturing fluctuations. A CMP process means at the same time, however, that, for example, planar polysilicon structures on the semiconductor body surface that are used for example for chip edge constructions and other wiring or sensor structures are no longer present because they are removed by the CMP process.

SUMMARY

One embodiment of the present invention relates to a semiconductor component comprising a semiconductor body with at least one protective trench in the semiconductor body. An insulation layer is situated at least at the bottom of the protective trench. An electrically conductive layer having a thickness D is formed on the insulation layer in the protective trench, wherein the electrically conductive layer only partly fills the protective trench.

BRIEF DESCRIPTION OF THE DRAWINGS

The invention may be more completely understood from the following detailed description of various embodiments in connection with the accompanying drawings, in which.

DETAILED DESCRIPTION

Embodiments of the invention are explained in more detail below with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

Before the exemplary embodiments of the present invention are explained in more detail below with reference to the figures, it is pointed out that identical elements in the figures are provided with the same or similar reference symbols and that a repeated description of these elements is omitted. Furthermore, the figures are not necessarily true to scale; rather, the main emphasis is on elucidating the basic principle.

Figure 1:
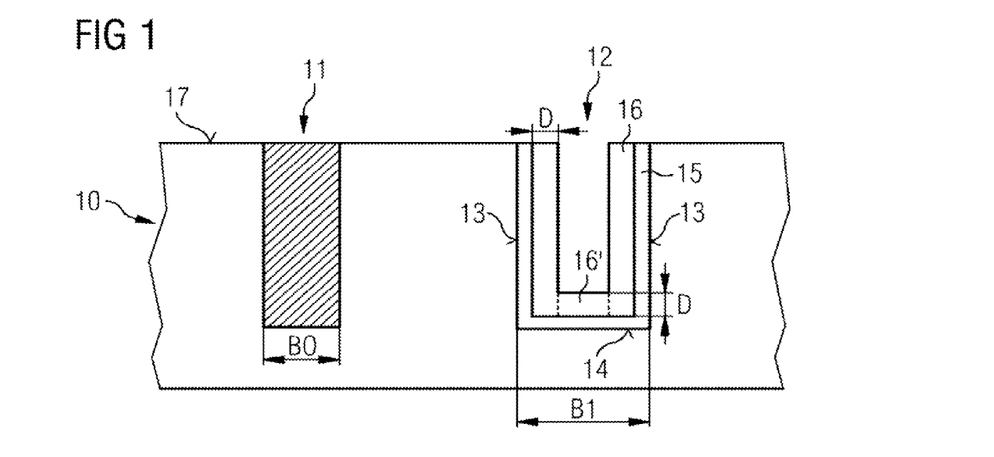
FIG. 1 shows, in a schematic cross-sectional view, an embodiment of a semiconductor body with a cell trench and an electrically conductive layer in a protective trench.

FIG. 1 illustrates an excerpt from a semiconductor component with a semiconductor body 10. In this case, any known semiconductor material which is suitable for producing semiconductor components can be used as material for the semiconductor body 10. As an example, silicon, germanium, silicon carbide, gallium arsenide, indium phosphide, etc. shall be mentioned for this, without restriction to these specific materials.

A cell trench 11 and a protective trench 12 are formed in the semiconductor body 10. A cell trench 11 should be understood hereinafter to mean a trench which is part of an active cell structure such as a transistor, for example. In this case, by way of example, a gate electrode and/or a field plate of a field plate transistor are/is arranged in the cell trench 11. However, it is also possible to form other structures such as, for example, compensation structures in the cell trench.

The protective trench 12 is formed at a distance from the cell trench 11 laterally, that is to say in a direction parallel to a main surface 17 of the semiconductor body 10. The protective trench 12, having a width B1, is generally wider than the cell trench 11 having a width B0. An insulation layer 15 is arranged in the protective trench 12 at least at the bottom 14 and, for example, at the sidewalls 13 of the protective trench 12. The insulation layer 15 is for example an oxide layer, in particular for example a silicon dioxide layer in the case of a silicon semiconductor material that is produced thermally from the semiconductor material of the semiconductor body or by layer deposition in the protective trench 12.

An electrically conductive layer 16 having a thickness D is arranged on the insulation layer 15 in the protective trench 12. The electrically conductive layer 16 is produced with a thickness only such that it only partly fills the protective trench 12. The electrically conductive layer 16 can be for example, but without restriction to this specific material, a polycrystalline silicon layer or a metal such as tungsten, for example.

The arrangement of the electrically conductive layer 16 in the protective trench 12 permits the main surface 17 of the semiconductor body 10 to be treated, in particular leveled, without influencing the electrically conductive layer 16 in the protective trench 12. Optionally, for this purpose, a protective layer (not illustrated) is at least partly applied on the electrically conductive layer 16 in the protective trench 12. Said protective layer can protect the electrically conductive layer 16 arranged in the protective trench 12 against undesired chemical removal, for example. For this purpose, it is possible to use a nitride protective layer, for example, which permits silicon to be selectively etched in order nevertheless to obtain an e.g. polysilicon layer as electrically conductive layer 16 in the protective trench 12.

Moreover, the arrangement of the electrically conductive layer 16 in the protective trench 12 makes it possible for an electrically conductive layer required for forming the structures in the cell trench 11 also to be used for other functions in the protective trench 12. In particular, the electrically conductive layer 16 can be produced simultaneously both in the cell trench and in the protective trench if the same material is used therefore. The formation of the electrically conductive layer 16 with a defined thickness D makes it possible to set the electrical properties of the sought function of the electrically conductive layer 16 very exactly and reproducibly. Thus, an electrical component such as, for example a diode, a bipolar transistor, a channel stopper, a screening field plate, a resistor or an interconnect can be formed in the electrically conductive layer 16 in the protective trench 12. In this case, the electrically conductive layer 16 can have a dopant, in particular a dopant having different conduction types p and n at least in two partial regions 16a and 16b. In the electrically conductive layer 16, it is also possible for two or more electrical components to be formed in series. In order to realize differently doped partial regions 16a and 16b, a protective trench 12 having a width B1 where B1 is greater than 2.5 times the thickness D (B1>2.5 D) of the electrically conductive layer 16 is suitable, in particular. As a result, a planar region 16' of the electrically conductive layer 16 arises at the bottom of the protective trench 12, in the case of which planar region a surface of the electrically conductive layer 16 that is directed to the main surface 17 of the semiconductor body 10 runs at least partly in the protective trench parallel to the main surface of the semiconductor body 10. In this case, the surface of the planar region 16' lies below the main surface 17 of the semiconductor body in the protective trench 12. The planar region 16' can thus be treated by means of conventional implantation methods in order to introduce the desired dopants, for example.

The formation of the electrically conductive layer in a protective trench makes it possible to carry out surface treatments of the semiconductor body such as, for example, CMP processes for levelling the semiconductor body surface, without electrical functional layers that are already present being removed in the process. The formation of the electrically conductive layer with a defined thickness D ensures that the electrical properties of the layer and hence the functions of the layer can be set precisely.

One embodiment provides for the electrically conductive layer to be arranged at least in sections only at the bottom of the protective trench.

A further embodiment provides for at least one part of an electrical component to be formed in the electrically conductive layer. In particular, the at least one part of the electrical component is formed in a part of the electrically conductive layer that is arranged at the bottom.

The electrical component can also be formed completely in the electrically conductive layer.

One embodiment involves the at least one part of the electrical component being at least one gate electrode 18.

In particular, the at least one gate electrode is part of a planar MOS field effect transistor at the bottom of the protective trench.

Further embodiments provide for the electrical component to be a diode, a bipolar transistor or a screening field plate.

However, the electrically conductive layer can also have a combination of different electrical components.

One embodiment involves the electrically conductive layer comprising polysilicon.

A further embodiment involves the electrically conductive layer having a dopant at least locally.

Furthermore, at least two partial regions of the electrically conductive layer can have a dopant of a different conduction type.

In one embodiment the protective trench has a width B1 wherein B1>2.5×D.

One embodiment involves the electrically conductive layer being electrically connected at least to a connection device.

In one development, the electrical connection between the electrically conductive layer and the connection device is arranged at least partly in an auxiliary trench.

In one embodiment, the auxiliary trench has a width B2 where B2<2 D.

In one embodiment a surface of the electrically conductive layer that is directed to a main surface of the semiconductor body runs at least partly parallel to the main surface of the semiconductor body in the protective trench.

One embodiment provides for a cell trench to be formed in the semiconductor body.

In one embodiment the protective trench is wider than the cell trench.

One embodiment variant involves the cell trench and the protective trench being arranged together in a cell array.

Another embodiment variant provides for the cell trench to be arranged in a cell array and the protective trench to be arranged in an edge region.

One embodiment provides for a protective layer to be at least partly applied on the electrically conductive layer in the protective trench. Said protective layer can protect the electrically conductive layer against e.g. undesired chemical influences such as e.g. removal by etching during a CMP of the semiconductor body surface.

A further embodiment relates to a method for producing a semiconductor component. In this case, a semiconductor body is provided and at least one protective trench is produced in the semiconductor body. An insulation layer is produced at least at the bottom of the protective trench. An electrically conductive layer having a thickness D is produced on the insulation layer in the protective trench, wherein the layer only partly fills the protective trench.

The production of a protective trench makes it possible to maintain electrically conductive layers in the protective trench which are utilized as functional layers for the semiconductor component, including during a surface treatment of the semiconductor body. The electrically conductive layer arranged in the protective trench is protected against a surface treatment of the semiconductor body. Depending on the configuration of the protective trench and depending on the thickness D of the electrically conductive layer, it is possible to realize different functional units with the electrically conductive layer.

One embodiment of the method involves the protective trench being produced together with a cell trench in the semiconductor body in one method step.

In one embodiment the electrically conductive layer is produced in such a way that at least one partial region of the layer surface runs parallel to a main surface of the semiconductor body.

In a further embodiment the electrically conductive layer is provided with a dopant at least locally.

In yet a further embodiment the dopant is implanted into the electrically conductive layer and subsequently activated.

In one embodiment of the method it is provided that the electrically conductive layer is firstly at least also partly produced on the main surface of the semiconductor body and the layer on the main surface of the semiconductor body is subsequently removed again.

The removal of the electrically conductive layer on the main surface in one embodiment is effected by means of chemical mechanical polishing.

In one embodiment a protective layer can at least partly be applied on the electrically conductive layer in the protective trench.

Figure 2:
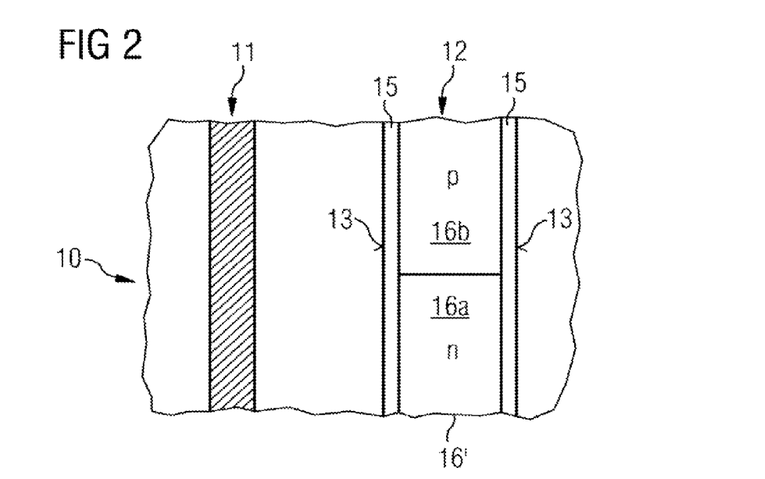
FIG. 2 shows, in a schematic plan view, an embodiment of a semiconductor body with a cell trench and a protective trench, in which an electrically conductive layer with a pn junction is formed.

An embodiment wherein the electrically conductive layer 16 has a dopant at least locally is illustrated in FIG. 2, by way of example. FIG. 2 is a plan view of a semiconductor body 10 with a cell trench 11 and a protective trench 12. In the protective trench 12, a planar region 16' of an electrically conductive layer 16, said planar region being arranged at the bottom 14 of the protective trench 12, is shown on an insulation layer 15. The planar region 16' has locally differently doped regions 16a and 16b doped with dopants of different conduction types p and n. The electrically conductive layer 16 can thus form, as illustrated, a diode having a pn junction or else form (in a form that is not illustrated) a bipolar transistor, for example, wherein a further region doped with a dopant of the other conduction type with respect to the adjacent region 16a or 16b is arranged in the planar region 16' of the electrically conductive layer 16 and thus forms a pnp or npn structure of a bipolar transistor.

Figure 3:
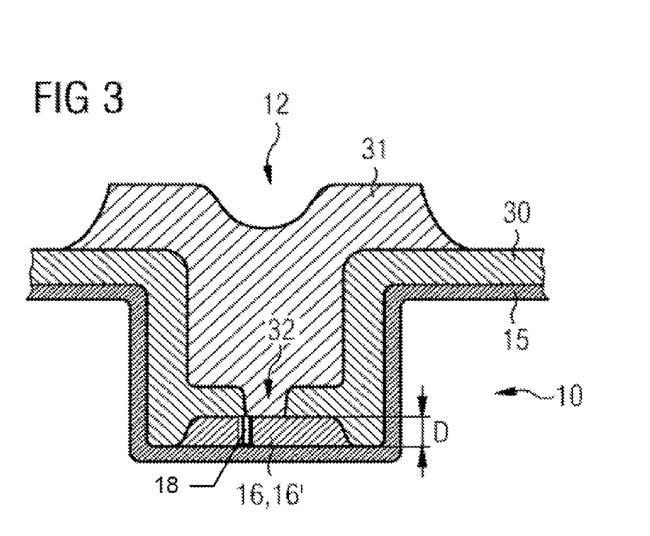
FIG. 3 shows, in a schematic cross-sectional view, a protective trench in a semiconductor body with an electrically conductive layer only at the bottom of the protective trench.

FIG. 3 shows, in a cross-sectional view of a protective trench 12 in a semiconductor body 10, an exemplary embodiment of an electrically conductive layer 16 wherein only a planar region 16' of the electrically conductive layer 16 having a thickness D is arranged at the bottom of the protective trench 12 on the insulation layer 15 produced at least at the bottom 14 of the protective trench 12. On the insulation layer 15 not covered by the electrically conductive layer 16, which insulation layer in this example extends over the edges of the protective trench 12 right onto the main surface 17 of the semiconductor body 10, and on parts of the electrically conductive layer 16 it is possible to apply an intermediate oxide (IOX) 30, as illustrated, wherein the IOX layer 30 leaves open at least one connection opening on the electrically conductive layer 16. The IOX layer 30 fills the protective trench 12 only partly. The connection opening 32 in the IOX layer 30 and the remainder of the protective trench 12 are filled by a contact-making material 31, which is usually composed of a metal. The contact material 31 produces an electrical connection between the electrically conductive layer 16 and a connection device (not illustrated).

Figure 4:
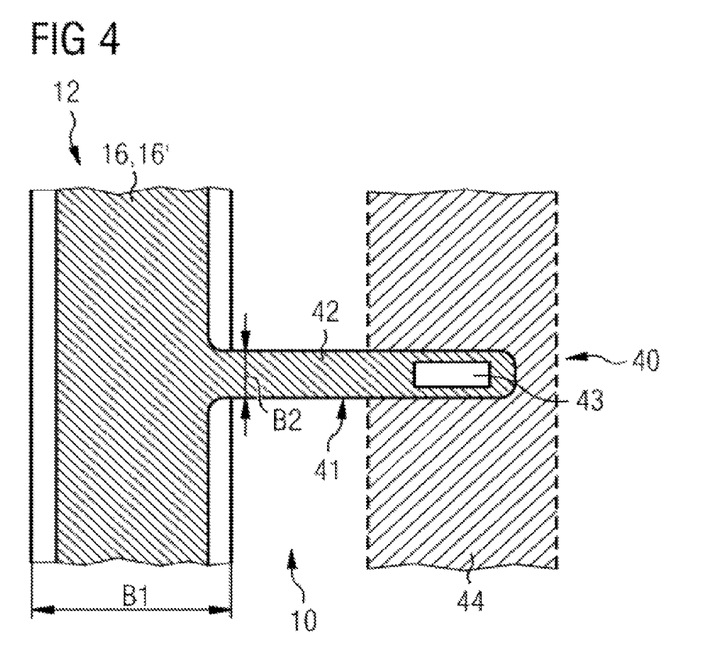
FIG. 4 shows, in a schematic plan view, a protective trench in a semiconductor body with an electrically conductive layer, wherein the electrically conductive layer is connected to a connection device via an auxiliary trench.

FIG. 4 illustrates, in a plan view of a semiconductor body 10, a variant for electrically connecting the electrically conductive layer 16 to a connection device 40. For this purpose, an auxiliary trench 41 is led out laterally from the protective trench 12, and the auxiliary trench is filled with an electrically conductive material 42, wherein the electrically conductive material 42 makes contact with the electrically conductive layer 16, and the connection device 40 is applied on the electrically conductive material 42 above the auxiliary trench 41. In this case, the auxiliary trench 41 can be led out from the protective trench 12 for example perpendicular to an elongate extent of the protective trench 12. By way of example, the same material as is used for the electrically conductive layer 16 itself can be used as electrically conductive material 42 for filling the auxiliary trench 41 and making contact with the electrically conductive layer 16, whereby production is significantly simplified. By forming the auxiliary trench 41 with a width B2 less than twice the thickness D of the electrically conductive layer (B2<2 D), it is possible, for example, for the auxiliary trench 41 to be filled during the formation of the electrically conductive layer 16 by the electrically conductive layer 16 also being produced at the sidewalls of the auxiliary trench 41 and growing together in the process. In the example shown, the connection device 40 comprises a metal plug arranged on the electrically conductive material 42 in a contact hole and a metallization layer 44 connected to said metal plug 43. A further electrically active structure below the protective trench can also be connected via the electrically conductive material 42 in the auxiliary trench.

Figure 5:
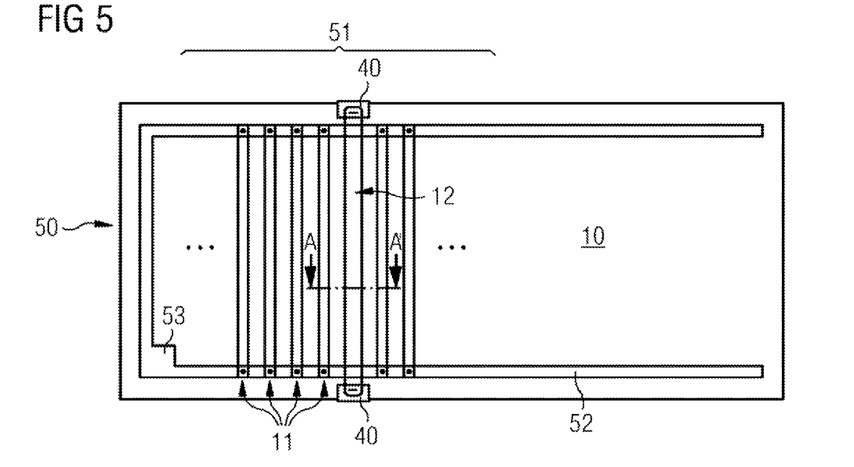
FIG. 5 shows, is a schematic plan view, a semiconductor component with cell trenches and protective trenches.

FIG. 5 shows, in a plan view, an exemplary embodiment of a semiconductor component 50 wherein a multiplicity of cell trenches 11 and at least one protective trench 12 are arranged in a cell array 51. The cell trenches 11 are connected to a contact-making ring 52 running around the cell array 51 and thereby to a contact-making pad 53. In the example of gate electrodes located in the cell trenches 11, said contact-making ring 52 is also referred to as a gate runner.

The protective trench 12 is likewise arranged in the cell array 51 between the cell trenches 11 and in contact with a connection device 40 at the ends of the protective trench 12 outside the cell array 51. As an alternative, however, the protective trench 12 can also be arranged outside the cell array 51 in an edge region.

Figure 6:
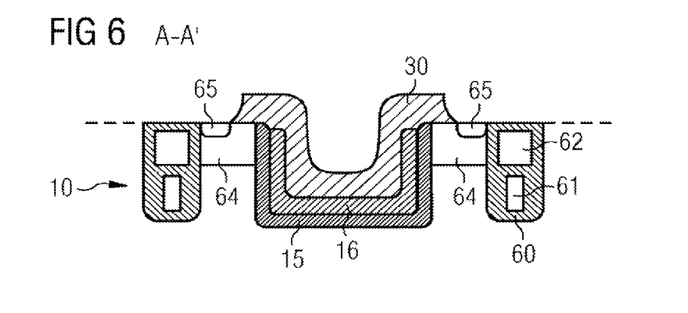
FIG. 6 shows, in a schematic cross-sectional view, a semiconductor body with cell trenches and a protective trench, in which an electrically conductive layer is arranged.

FIG. 6 shows, in a cross-sectional view, an excerpt from the semiconductor component concerning FIG. 5 along the sectional line A-A'. In this case, two cell trenches 11 are shown by way of example, in each of which a field plate 61 and an overlying gate electrode 62 are arranged, which are insulated from one another and from the semiconductor body 10 by a dielectric 60. In the semiconductor body 10, a protective trench 12 is formed between the two cell trenches 11, said protective trench being wider than the cell trenches 11, wherein an insulation layer 15 and an electrically conductive layer 16 arranged on the insulation layer 15 are arranged in the protective trench 12. Situated above the insulation layer 15 and the electrically conductive layer 16 there is additionally also an intermediate oxide layer (IOX) 30 in the protective trench. Arranged adjacent to the gate electrode 62 in the cell trenches 11 there is in each case a body zone 64 in the semiconductor body 10, said body zone being spaced apart from the gate electrodes 62 by a thin dielectric layer 60. In addition, in each case a source zone 65 is arranged in the body zone 64, said source zone being separated from the semiconductor body 10 by the body zone 64.

As a result of the close positioning of the electrical functional units formed in the protective trench 12 in the electrically conductive layer 12, such as diodes or resistors, for example, which can be used as temperature sensors or current sensors, with respect to the exemplary transistor cells, it is possible to achieve a better homogeneity in the temperature or alternatively current sensor system.

A description will now be given below of exemplary method steps for producing a semiconductor component with a protective trench 12 for an electrically conductive layer 16. For this purpose, firstly a semiconductor body 10 is provided. At least one protective trench 12 is produced in the semiconductor body 10. The at least one protective trench 12 is generally produced by etching; in particular, this etching can also be an etching operation for a further production step in the production process for the semiconductor component, such as, for example, the etching for an additional cell trench or for the isotropic edge defect etching. The protective trench 12 should be formed for example with a depth of at least 1 μm into the semiconductor body 10, in order to ensure the protective function desired of it. For protective trenches 12 having a width B1>10 μm, the depth of the protective trench 12 into the semiconductor body 10 can also be significantly more than 2 μm.

After the formation of the protective trench 12, the protective trench 12 is lined with an insulation layer 15 at least at the bottom 14. In this case, the bottom 14 can also be provided only partly with the insulation layer 15. Said insulation layer 15 is generally produced by an oxidation process wherein the semiconductor material of the semiconductor body 10 is converted into an insulating oxide. However, deposition of an insulation layer 15 in the protective trench 12 is also conceivable. After the production of the insulation layer 15 at least at the bottom 14 of the protective trench 12, which, however, can also be effected at the sidewalls 13 of the protective trench 12 and additionally also on the main surface 17 of the semiconductor body 10, the electrically conductive layer 16 is produced in the protective trench 12 with a thickness D at least on partial regions of the insulation layer 15. This is generally effected by deposition of an electrically conductive material, such as polysilicon or a metal, for example, on the insulation layer 15. The deposition can be effected for example from the vapour phase or by sputtering. The production of the electrically conductive layer 16 in the protective trench is effected, in particular, at the bottom 14 of the protective trench 12, but can also be effected at the sidewalls 13 of the protective trench 12 and additionally also over the main surface 17 of the semiconductor body 10.

One simple production process provides, for example, for producing at least one additional cell trench at the same time as the protective trench. For this purpose, by way of example, the same etching process is used both for the etching of the cell trench and for the etching of the protective trench.

A further simple production process provides, for example, for simultaneously producing electrically active structures in an existing cell trench 11 and the electrically conductive layer 16 in the protective trench 12. For this purpose, the same material is deposited simultaneously in one process step both in the cell trenches 11 and in the protective trench 12. In the case of a cell trench width B0 that is less than the protective trench width B1, the cell trench 11 can be completely filled with the electrically conductive material used, while in the protective trench 12 only an electrically conductive layer 16 having a thickness D forms at least at the bottom 14 of the protective trench 12. For this case, the following conditions should be met:

B0<2 D and B1>2 D. If the electrically active layer is deposited only at the bottom 14 of the protective trench 12, the sidewalls 13 of the protective trench 12 can be protected with a sacrificial layer (not illustrated) with the aid of so-called spacer technology, said sacrificial layer being removed again after the deposition of the electrically conductive layer 16. During the deposition of the electrically conductive layer 16, the layer 16 may also be deposited on the main surface 17 of the semiconductor body 10. This region of the electrically conductive layer 16 that is deposited on the main surface 17 of the semiconductor body 10 is generally removed again, particularly when a surface treatment, such as CMP, for example, of the semiconductor body 10 is required. This is the case, for example, if very small structure dimensions of the semiconductor component require very high requirements made of the accuracy for recess processes, for example. Particularly for protection against chemical attack during an etching process, a protective layer can at least partly be applied to the electrically conductive layer 16 in the protective trench 12. Said protective layer can also be removed again after the etching step. After the surface treatment of the semiconductor body 10, it is possible to carry out for example a recess step for forming the required cell geometry at the electrically active structures, such as a gate electrode, for example, in the cell trenches 11. Such a recess step provides for example for producing a shallow trench having a depth of approximately 50 nm to 100 nm. With the use of the same material both in the cell trench and for the electrically conductive layer 16 in the protective trench 12, this recess step at the electrically conductive layer 16 leads only to little removal of the electrically conductive layer 16 at the edge of the protective trench 12 with respect to the main surface 17. The electrically conductive layer 16 in the protective trench 12 can then optionally be subjected to further treatment.

Figure 7A:
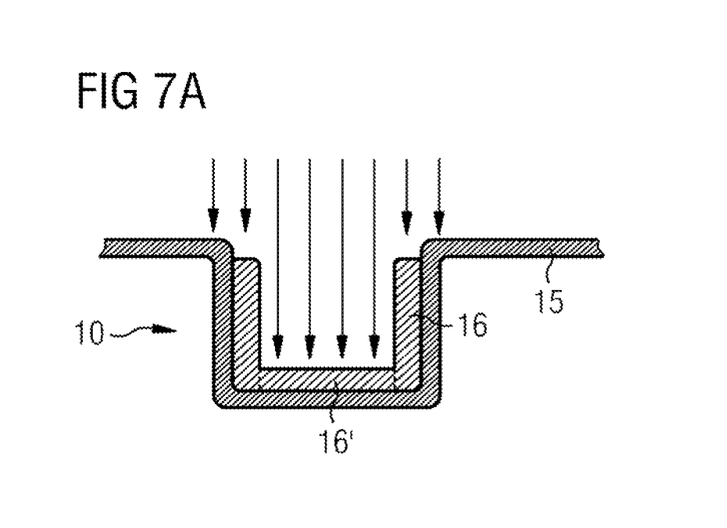
FIGS. 7A and 7B illustrate an exemplary embodiment of a method for producing an electrically conductive layer with a doped planar region on the basis of schematic cross-sectional views through the semiconductor body during individual method steps.

Thus, as illustrated as an exemplary embodiment in FIG. 7a, a dopant can be introduced by the implantation in at least the planar region 16' of the electrically conductive layer 16 and can be activated by heat treatment. The implanted dopants can optionally also be outdiffused even further in the electrically conductive layer 16.

The electrically conductive layer 16 can also be patterned by means of a depth-sensitive phototechnology in the protective trench 12, such that, by way of example, at least locally, only a planar region 16' remains at the bottom 14 of the protective trench 12.

Figure 7B:
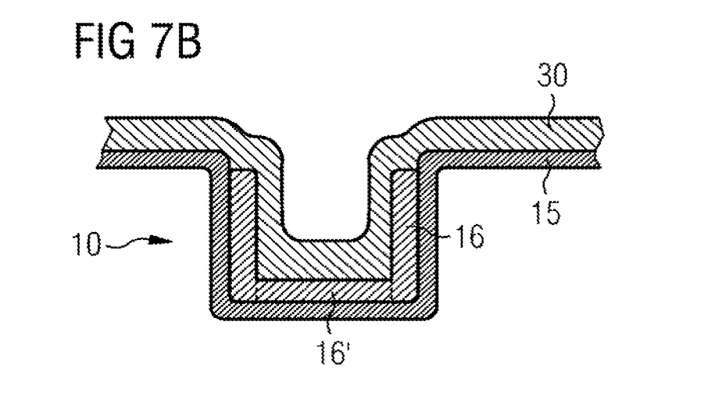

FIG. 7b illustrates a further exemplary embodiment of a further method step, wherein an intermediate oxide layer (IOX) 30 for the electrical insulation of the electrically conductive layer 16 is deposited over the electrically conductive layer 16. In this case, electrical contact is made with the electrically conductive layer 16 for example by means of measures as described with regard to FIG. 3 or FIG. 4.

The formation of a contact hole in the IOX 30 for electrically linking the electrically conductive layer 16, as shown in FIG. 3, is possible for example likewise by means of a depth-sensitive phototechnology in the protective trench 12. An embodiment variant (not illustrated) of a semiconductor component wherein a channel stopper drain ring with the electrically conductive layer 16 is formed in the protective trench 12 can provide a connection variant of the electrically conductive layer 16 with the aid of an insulation layer thinner than the insulation layer 15 at a selected location of the protective trench 12 or optionally at a selected location of an auxiliary trench 41 possibly present in accordance with the embodiment concerning FIG. 4. Said selected location preferably lies in a chip corner towards the sawing track (that is to say the edge of the semiconductor body 10). Thus, by way of example, during the testing of the semiconductor component, a voltage which breaks down the thin insulation layer that is harmless for the actual insulation layer 15 can produce a low-impedance connection to the drain potential, which is present in some semiconductor component types anywhere around the trench bottom in the edge region of the semiconductor body 10. For applying the voltage for testing the semiconductor component and for breaking down the thin insulation layer, a large-area protective trench region can likewise be provided in the chip corner region, by way of example, in which protective trench region it is possible to place a measuring needle onto the electrically conductive layer 16.

What is claimed is:

1. A method for producing a semiconductor component, comprising:
   providing a semiconductor body, producing at least one protective trench in the semiconductor body,
   producing an insulation layer on the sidewalls and at the bottom of the protective trench,
   producing an electrically conductive layer having a thickness D on the insulation layer in the protective trench, wherein the electrically conductive layer only partly fills the protective trench,
   applying another insulation layer over the electrically conductive layer, the another insulation layer disposed at least partially in the protective trench and having a connection opening providing access to the electrically conductive layer,
   applying a protective layer in the protective trench such that the protective layer is at least partially on the electrically conductive layer.

2. The method according to claim 1, wherein, in one production step, the protective trench is produced together with a cell trench in the semiconductor body.

3. The method according to claim 1, wherein the electrically conductive layer is produced in such a way that at least one partial region of the layer surface runs parallel to a main surface of the semiconductor body.

4. The method according to claim 1, wherein the electrically conductive layer is provided with a dopant at least locally.

5. The method according to claim 4, wherein the dopant is implanted into the electrically conductive layer and subsequently activated.

6. The method according to claim 1, wherein a portion of the electrically conductive layer is firstly partly produced on a main surface of the semiconductor body and is subsequently removed.

7. The method according to claim 6, wherein the removal of the electrically conductive layer on the main surface of the semiconductor body is by way of chemical mechanical polishing.

8. The method according to claim 1, wherein the electrically conductive layer is arranged at the bottom of the protective trench only.

9. The method according to claim 1, further comprising forming an electrical component in the electrically conductive layer.

10. The method according to claim 9, wherein the at least one part of the electrical component is formed in a part of the electrically conductive layer that is arranged at the bottom of the protective trench.

11. The method according to claim 1, wherein the electrically conductive layer only partially covers a horizontal surface of the insulation layer at least at the bottom of the protective trench.

12. The method according to claim 11, wherein the another insulation layer at least covering vertical edge surfaces of the electrically conductive layer.

13. The method according to claim 1, wherein the electrically conductive layer has a substantially planar bottom surface adjacent to a substantially planar surface of the insulation layer.

14. The method according to claim 1, wherein the at least one protective trench in the semiconductor body has a width B1, the width B1 being at least greater than 2.5 times the thickness D (B1>2.5×D).

* * * * *